METHOD OF EPITAXIALLY DEPOSITING GALLIUM
NITRIDE FROM THE LIQUID PHASE
Filed Feb. 20, 1973
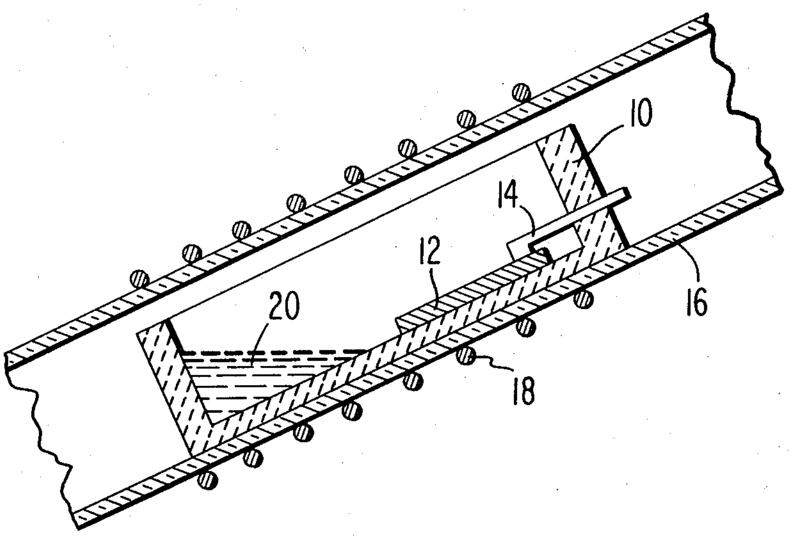

United States Patent Office 3,811,963
Patented May 21, 1974

3,811,963

METHOD OF EPITAXIALLY DEPOSITING GALLIUM NITRIDE FROM THE LIQUID PHASE

Frank Zygmunt Hawrylo, Trenton, and Jacques Isaac Pankove, Princeton, N.J., assignors to RCA Corporation
Filed Feb. 20, 1973, Ser. No. 333,528
Int. Cl. H01l 7/38
U.S. Cl. 148—172 7 Claims

ABSTRACT OF THE DISCLOSURE

An epitaxial layer of gallium nitride is deposited from a melt containing a small concentration of gallium and a large concentration of a metal or mixture of metals which do not form a stable compound with nitrogen. The melt is subjected to an atmosphere containing nitrogen so as to form gallium nitride in the melt. A substrate is brought into contact with the gallium nitride containing melt and the melt is cooled to deposit gallium nitride from the melt onto the substrate. The substrate is then separated from the melt.

BACKGROUND OF THE INVENTION

The present invention relates to a method of epitaxially depositing a layer of crystalline gallium nitride on a substrate, and, mode particularly, to such a method where the gallium nitride is deposited from the liquid phase.

Gallium nitride, GaN, is a semiconductor material having a wide band gap energy. As shown in U.S. Pat. No. 3,683,240 to J. I. Pankove, issued Aug. 8, 1972, entitled "Electroluminescent Semiconductor Device of GaN," this material is highly suitable for making electroluminescent devices. To make such electroluminescent devices, it is desirable to be able to form epitaxial layers of the gallium nitride. Epitaxial layers of gallium nitride have been formed by the technique of vapor phase epitaxy as described in the article. "The Preparation and Properties of Vapor-Deposited Single-Crystalline GaN" by H. P. Maruskas and J. J. Tietjen, published in Applied Physics Letters, volume 15, page 327 (1969). Another technique for forming epitaxial layers of semiconductor material which is more simple to carry out than vapor phase epitaxy is known as "liquid phase epitaxy." As described in the article "Epitaxial Growth From the Liquid State and Its Application to the Fabrication of Tunnel and Laser Diodes" by H. Nelson, published in RCA Review, volume 24, page 603 (1963), liquid phase epitaxy includes depositing the epitaxial layer from a melt containing the semiconductor material. A surface of a substrate on which the epitaxial layer is to be deposited is brought into contact with the heated melt which is then cooled to precipitate out some of the semiconductor material and deposit the semiconductor material on the substrate as an epitaxial layer.

The elements of most semiconductor materials which are deposited by liquid phase epitaxy are either solids or liquids at room temperature. Thus, melts of these semiconductor materials can be easily formed by heating a charge containing these elements. However, one of the elements of gallium nitride, i.e. nitrogen, is a gas at room temperature and above. Heretofore, gallium nitride has been synthesized by reacting ammonia with liquid gallium so that this technique should be suitable for forming the solution for liquid phase epitaxy of gallium nitride. However, it has been found that when the ammonia is reacted with liquid gallium to form the deposition solution, small microcrystallites of gallium nitride are formed. These microcrystallites act as nucleating centers which compete with any substrate for crystal growth. Also, these microcrystals eventually grow into a porous mass of interconnected flakes which can interfere with the good growth of the epitaxial layer on the substrate.

SUMMARY OF THE INVENTION

An epitaxial layer of crystalline gallium nitride is deposited on a substrate by forming a melt of gallium and a metal which does not form a stable compound with nitrogen and subjecting the melt to an atmosphere which includes nitrogen to form gallium nitride in the melt. A surface of the substrate is brought into contact with the gallium nitride containing melt and the melt is cooled to deposit an epitaxial layer of gallium nitride on the substrate. The cooled substrate is then separated from the melt. Preferably, the amount of the gallium in the original melt is very small as compared to the amount of the other metal.

BRIEF DESCRIPTION OF THE DRAWING

The drawing is a view of an apparatus which is suitable for carrying out the method of the present invention.

DETAILED DESCRIPTION

To deposit an epitaxial layed of crystalline gallium nitride, GaN, on a substrate in accordance with the present invention, a melt is formed which includes gallium and a metal or mixture of metals which do not form a stable compound with nitrogen and which have a melting temperature lower than the boiling temperature of gallium, such as indium and germanium. Preferably, the melt contains only a smaller amount of the gallium than the other constituents, preferably not greater than about 30% by weight. More preferably, when indium and/or germanium is used, the amount of gallium should not be greater than about 5% by weight. The melt can be formed by placing the ingredients of the melt in a refractory furnace boat, such as the boat 10 shown in the drawing, which may be made of graphite. The ingredients of the melt are placed at one end of the boat 10 and a flat substrate 12 on which the epitaxial layer is to be deposited is positioned at the other end of the boat. The substrate 12 may be of any material on which an epitaxial layer can be deposited, such as sapphire or a single crystalline Group III–V compound. The substrate 12 is secured to the bottom of the boat 10 by a suitable clamp 14.

The furnace boat 10 and its contents are placed in a furnace tube 16, which may be of quartz, having a heating means, such as a resistance heater 18. The furnace tube 16 is tilted so that the end of the furnace boat 10 which contains the charge is lower than the end containing the substrate 12, as shown in the drawing. A flow of an inert gas, such as hydrogen, is passed through the furnace tube 16 and the heater 18 is turned on to heat the furnace boat 10 and its contents to a temperature at which the ingredients of the charge become molten, generally 950° C. to 1050° C., to form the melt 20. When the ingredients of the melt 20 are completely molten, the flow of the inert gas through the furnace tube 16 is stopped and a flow of an atmosphere containing nitrogen is passed through the furnace tube 16. The nitrogen atomsphere may be vapors of a material containing nitrogen which will disassociate at the temperature of the furnace to provide nitrogen, such as ammonia or an ammine of gallium. As the nitrogen atmosphere passes over the boat 10, the nitrogen reacts with the gallium in the melt 20 to form gallium nitride. When an ammine of gallium is used, the ammine may also decompose into a gallium nitride molecule which is readily soluble in the melt 20.

After the gallium in the melt 20 has been exposed to the nitrogen containing atmosphere long enough to form the gallium nitride in the melt, the melt 20 containing the gallium nitride is brought into contact with the surface of the substrate 12. In the apparatus shown in the drawing, this is achieved by tilting the furnace tube 16 so that the substrate 12 is lower than the melt 20. This causes the melt 20 to flow over and flood the substrate 12. The temperature of the furnace tube 16 is then lowered so as to cool the boat 10 and its contents. As the melt 20 cools, the gallium nitride in the melt deposits out on the surface of the substrate 12 to form the epitaxial layer of gallium nitride. After the epitaxial layer of the gallium nitride is deposited on the substrate 12, the substrate and the melt are separated. In the apparatus shown, this is achieved by tilting the furnace tube 16 back to its original position, as shown in the drawing so as to decant the melt from the substrate. The boat 10 can then be removed from the furnace tube 16 so as to permit the substrate 12 with the epitaxial layer thereon to be removed from the boat.

In the method of the present invention, the melt includes along with the gallium, a metal which does not form a stable nitride with the amount of the gallium in the melt being smaller than the amount of the other constituents. Thus, when the melt is exposed to the nitrogen, only the small amount of gallium in the melt is converted to gallium nitride. Since only a small proportion of the melt is converted to the nitride, the gallium nitride can diffuse through the melt to the substrate where it deposits epitaxially on the substrate without the formation of interfering flakes of microcrystals.

EXAMPLE

An epitaxial layer of crystalline gallium nitride can be deposited on a sapphire substrate by placing in a boat 10 of the type shown in the drawing, the substrate and a charge of 5 grams indium, 1 gram germanium and 0.5 gram gallium. The boat and its contents are placed in a furnace tube which is tilted so that the charge is lower than the substrate. While providing a flow of hydrogen through the furnace tube, the furnace tube is heated to a temperature of about 1050° C. to form the melt of indium, germanium and gallium. The temperature of the furnace tube is lowered to 1000° C. and the flow of hydrogen is changed to a flow of ammonia vapors through the furnace tube and over the boat to form the gallium nitride in the melt. After one hour, the temperature of the furnace tube is raised to 1040° C. and the furnace tube is tilted so as to cause the melt to flow over and flood a surface of the substrate. The temperature of the furnace tube is slowly lowered and after 2 hours the furnace tube is tilted back to its original position to decant the solution from the substrate. The substrate has on its surface a continuous epitaxial film of gallium nitride.

It should be understood that the above example is merely illustrative of one specific form of the method of the present invention and that the method can be carried out with other suitable metals used in the melt with the gallium, other ratios of the ingredients of the melt, other temperatures and other substrates. Also, although the method of the present invention has been described as being carried out in a tilt-type boat, it can be carried out in any well-known type of boat suitable for liquid phase epitaxy and which can expose the melt to an atmosphere containing nitrogen. For example, the method can be carried out in a slide-type boat such as shown and described in U.S. Pat. No. 3,565,702 to H. Nelson, entitled "Depositing Successive Epitaxial Semiconductor Layers From the Liquid Phase," issued Feb. 23, 1971. In addition, the melt may contain a conductivity modifier, such as zinc, magnesium, beryllium or lithium which becomes incorporated in the lattice of the gallium nitride epitaxial layer to provide an epitaxial layer of a desired conductivity type.

We claim:

1. A method of depositing on a substrate an epitaxial layer of crystalline gallium nitride comprising the steps of
forming a melt of gallium and a metal which does not form a stable compound with nitrogen,
subjecting said melt to an atmosphere which includes nitrogen to form gallium nitride in said melt,
bringing a surface of the substrate into contact with the gallium nitride containing melt,
cooling said gallium nitride containing melt to deposit an epitaxial layer of gallium nitride on said surface of the substrate, and then
separating the coated substrate from the melt.

2. The method in accordance with claim 1 in which the amount of gallium in the original melt is smaller than the amount of the other constituents in the melt.

3. The method in accordance with claim 2 in which the amount of gallium in the melt is not greater than about 30% by weight.

4. The method in accordance with claim 1 in which the metal in the melt is indium or germanium or combinations thereof.

5. The method in accordance with claim 4 in which the amount of gallium in the melt is not greater than about 5% by weight.

6. The method in accordance with claim 1 in which the atmosphere containing nitrogen is vapors of ammonia.

7. The method in accordance with claim 1 including a conductivity modifier selected from the group consisting of zinc, magnesium, beryllium and lithium in the melt, which conductivity modifier becomes incorporated in the lattice of the gallium nitride epitaxial layer.

References Cited

UNITED STATES PATENTS

| | | | |
|---|---|---|---|
| 3,462,320 | 8/1969 | Lynch et al. | 148—171 |
| 3,560,275 | 2/1971 | Kressel et al. | 148—171 |
| 3,565,702 | 2/1971 | Nelson | 148—172 |
| 3,592,704 | 7/1971 | Logan et al. | 148—171 |
| 3,603,833 | 9/1971 | Logan et al. | 148—171 X |
| 3,632,431 | 1/1972 | Andre et al. | 117—201 |
| 3,683,240 | 8/1972 | Pankove | 317—235 N |

GEORGE T. OZAKI, Primary Examiner

U.S. Cl. X.R.

117—201; 148—171, 173; 252—62.3 GA; 317—235 R